(12) United States Patent
Pollard

(10) Patent No.: US 8,348,396 B2
(45) Date of Patent: Jan. 8, 2013

(54) FLUID EJECTION DEVICE

(75) Inventor: Jeffrey R. Pollard, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/156,770

(22) Filed: Jun. 9, 2011

(65) Prior Publication Data

US 2012/0314006 A1    Dec. 13, 2012

(51) Int. Cl.
*B41J 2/045* (2006.01)
(52) U.S. Cl. .................. 347/72; 347/70; 347/71; 347/68
(58) Field of Classification Search .................... 347/72, 347/70, 71, 68
See application file for complete search history.

(56) References Cited

U.S. PATENT DOCUMENTS

| 6,045,208 | A | 4/2000 | Hirahara et al. |
| 6,921,158 | B2 | 7/2005 | Zhang |
| 7,526,846 | B2 | 5/2009 | Bibl et al. |
| 2005/0248235 | A1* | 11/2005 | Namerikawa et al. ........ 310/328 |
| 2009/0109262 | A1* | 4/2009 | Cruz-Uribe et al. ............ 347/68 |
| 2009/0230088 | A1 | 9/2009 | Bibl et al. |

\* cited by examiner

*Primary Examiner* — Matthew Luu
*Assistant Examiner* — Henok Legesse

(57) ABSTRACT

A fluid ejection device includes a flexible membrane and an adhesive layer on the flexible membrane. The adhesive layer includes a first region and a second region extending from the first region. The fluid ejection device includes a piezoelectric material layer including an edge region and a central region. A surface of the edge region of the piezoelectric material layer is substantially coplanar with a surface of the second region of the adhesive layer. The surface of the edge region and the surface of the second region are substantially parallel with the flexible membrane.

15 Claims, 7 Drawing Sheets

FLUID EJECTION DEVICE

BACKGROUND

An inkjet printing system may include a printhead, an ink supply that supplies liquid ink to the printhead, and an electronic controller that controls the printhead. The printhead ejects drops of ink through a plurality of nozzles or orifices toward a print medium, such as a sheet of paper, to print onto the print medium. Typically, the orifices are arranged in one or more columns or arrays such that properly sequenced ejection of ink from the orifices causes characters or other images to be printed upon the print medium as the printhead and the print medium are moved relative to each other.

One type of printhead includes a piezoelectrically actuated printhead. The piezoelectrically actuated printhead includes a substrate defining a plurality of fluid chambers, a flexible membrane supported by the substrate and over the fluid chambers, and a plurality of actuators arranged on the flexible membrane. Each actuator includes a piezoelectric material that deforms when an electrical voltage is applied to the actuator. When the piezoelectric material deforms, a portion of the flexible membrane deflects thereby causing ejection of fluid from a fluid chamber through an orifice or nozzle. To optimize the performance of a printhead, crosstalk between adjacent piezoelectric actuators should be minimized.

DETAILED DESCRIPTION

In the following detailed description, reference is made to the accompanying drawings which form a part hereof, and in which is shown by way of illustration specific examples in which the disclosure may be practiced. In this regard, directional terminology, such as "top," "bottom," "front," "back," "leading," "trailing," etc., is used with reference to the orientation of the Figure(s) being described. Because components of examples of the present disclosure can be positioned in a number of different orientations, the directional terminology is used for purposes of illustration and is in no way limiting. It is to be understood that other examples may be utilized and structural or logical changes may be made without departing from the scope of the present disclosure. The following detailed description, therefore, is not to be taken in a limiting sense, and the scope of the present disclosure is defined by the appended claims.

Figure 1:
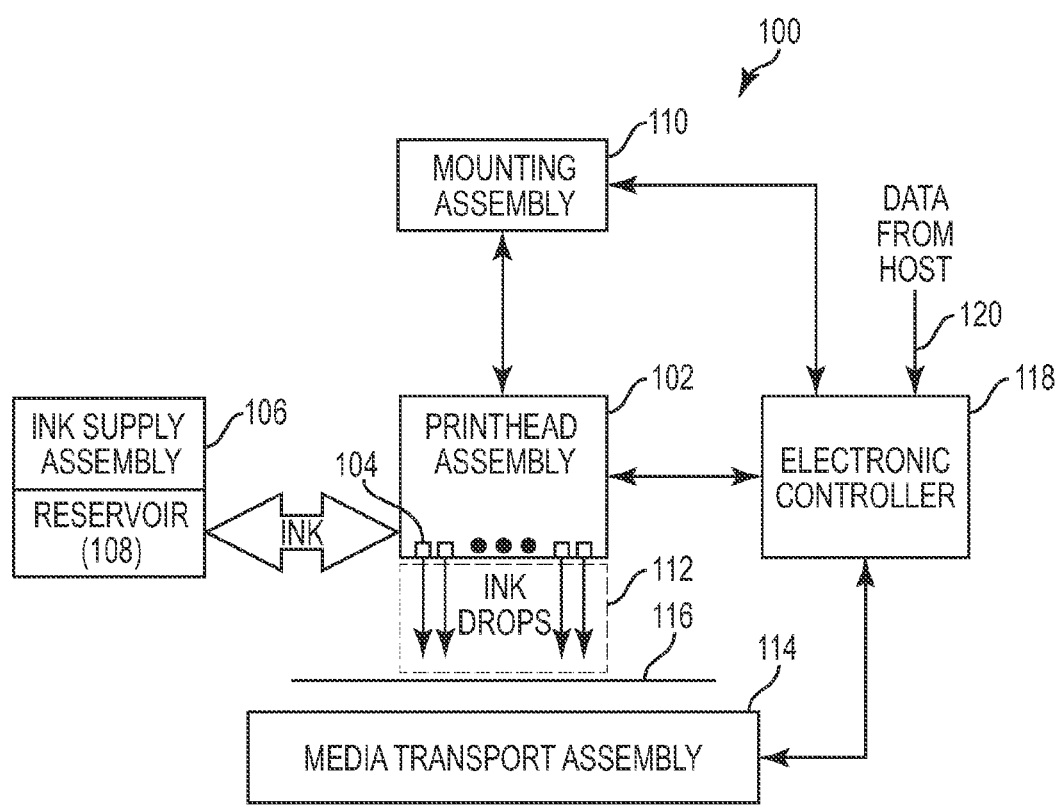
FIG. 1 is a block diagram illustrating one example of an inkjet printing system.

FIG. 1 is a block diagram illustrating one example of an inkjet printing system 100. Inkjet printing system 100 provides a fluid ejection system that includes a fluid ejection device, such as a printhead assembly 102. Inkjet printing system 100 also includes a fluid supply, such as an ink supply assembly 106, a mounting assembly 110, a media transport assembly 114, and an electronic controller 118.

Printhead assembly 102 ejects drops of ink, including one or more colored inks, through a plurality of orifices or nozzles 104. While the following disclosure refers to the ejection of ink from printhead assembly 102, in other examples other liquids, fluids, or flowable materials may be ejected from printhead assembly 102. Printhead assembly 102 includes a piezoelectric actuator for each nozzle 104. Each piezoelectric actuator is formed such that each piezoelectric actuator is mechanically separated from the adjacent piezoelectric actuators of printhead assembly 102. By mechanically separating each piezoelectric actuator from the adjacent piezoelectric actuators, crosstalk between adjacent piezoelectric actuators is minimized.

Each piezoelectric actuator is mechanically separated from the adjacent piezoelectric actuators by first pre-slitting bulk piezoelectric material prior to attaching the bulk piezoelectric material to a substrate for printhead assembly 102. After attaching the pre-slit bulk piezoelectric material to the substrate, the pre-slit bulk piezoelectric material is subjected to backgrinding. Subsequently, cuts aligned with the pre-slits are made in the bulk piezoelectric material to mechanically separate each piezoelectric actuator from adjacent piezoelectric actuators.

In one example, printhead assembly 102 directs drops of ink toward a medium, such as print medium 116, to print onto print medium 116. Typically, nozzles 104 are arranged in one or more columns or arrays such that properly sequenced ejection of ink from nozzles 104 causes characters, symbols, and/or other graphics or images to be printed upon print medium 116 as printhead assembly 102 and print medium 116 are moved relative to each other.

Print medium 116 includes paper, card stock, envelopes, labels, transparent film, cardboard, rigid panels, or other suitable medium. In one example, print medium 116 is a continuous form or continuous web print medium 116, such as a continuous roll of unprinted paper.

Ink supply assembly 106 supplies ink to printhead assembly 102 and includes a reservoir 108 for storing ink. As such, ink flows from reservoir 108 to printhead assembly 102. In one example, ink supply assembly 106 and printhead assembly 102 form a recirculating ink delivery system. As such, ink flows back to reservoir 108 from printhead assembly 102. In one example, printhead assembly 102 and ink supply assembly 106 are housed together in an inkjet or fluidjet cartridge or pen. In another example, ink supply assembly 106 is separate from printhead assembly 102 and supplies ink to printhead assembly 102 through an interface connection, such as a supply tube.

Mounting assembly 110 positions printhead assembly 102 relative to media transport assembly 114, and media transport assembly 114 positions print medium 116 relative to printhead assembly 102. As such, a print zone 112 within which printhead assembly 102 deposits ink drops is defined adjacent to nozzles 104 in an area between printhead assembly 102 and print medium 116. Print medium 116 is advanced through print zone 112 during printing by media transport assembly 114.

In one example, printhead assembly 102 is a scanning type printhead assembly, and mounting assembly 110 moves printhead assembly 102 relative to media transport assembly 114 and print medium 116 during printing of a swath on print medium 116. In another example, printhead assembly 102 is a non-scanning type printhead assembly, and mounting assembly 110 fixes printhead assembly 102 at a prescribed position relative to media transport assembly 114 during printing of a swath on print medium 116 as media transport assembly 114 advances print medium 116 past the prescribed position.

Electronic controller 118 communicates with printhead assembly 102, mounting assembly 110, and media transport assembly 114. Electronic controller 118 receives data 120 from a host system, such as a computer, and includes memory for temporarily storing data 120. Typically, data 120 is sent to inkjet printing system 100 along an electronic, infrared, optical, or other suitable information transfer path. Data 120 represents, for example, a document and/or file to be printed. As such, data 120 forms a print job for inkjet printing system 100 and includes one or more print job commands and/or command parameters.

In one example, electronic controller 118 provides control of printhead assembly 102 including timing control for ejection of ink drops from nozzles 104. As such, electronic controller 118 defines a pattern of ejected ink drops that form characters, symbols, and/or other graphics or images on print medium 116. Timing control and, therefore, the pattern of ejected ink drops, is determined by the print job commands and/or command parameters. In one example, logic and drive circuitry forming a portion of electronic controller 118 is located on printhead assembly 102. In another example, logic and drive circuitry forming a portion of electronic controller 118 is located off printhead assembly 102.

Figure 2:
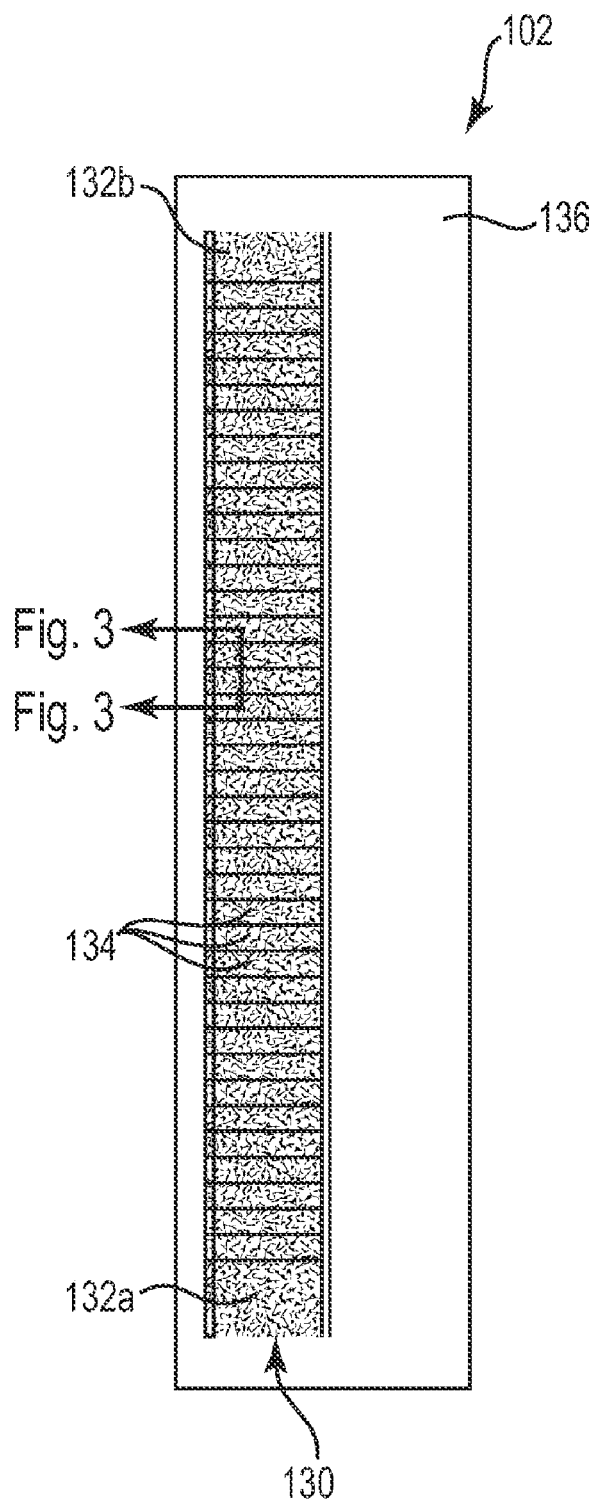
FIG. 2 illustrates a top view of one example of a printhead assembly.

FIG. 2 illustrates a top view of one example of printhead assembly 102. Printhead assembly 102 includes piezoelectric material 130, which has been mechanically separated into a plurality of individual piezoelectric actuators 134 and ground pads 132a and 132b. Ground pad 132a is formed at a first end of piezoelectric material 130, and ground pad 132b is formed at a second end of piezoelectric material 130 opposite the first end. Printhead assembly 102 includes an electrically conductive layer 136, which provides a ground connection between ground pads 132a and 132b and a lower electrode of each piezoelectric actuator 134. In one example, electrically conductive layer 136 is a metal layer, such as Cr, NiV, Au, or other suitable electrically conductive material. Printhead assembly 102 also includes an upper electrode on each piezoelectric actuator 134.

Figure 3A:
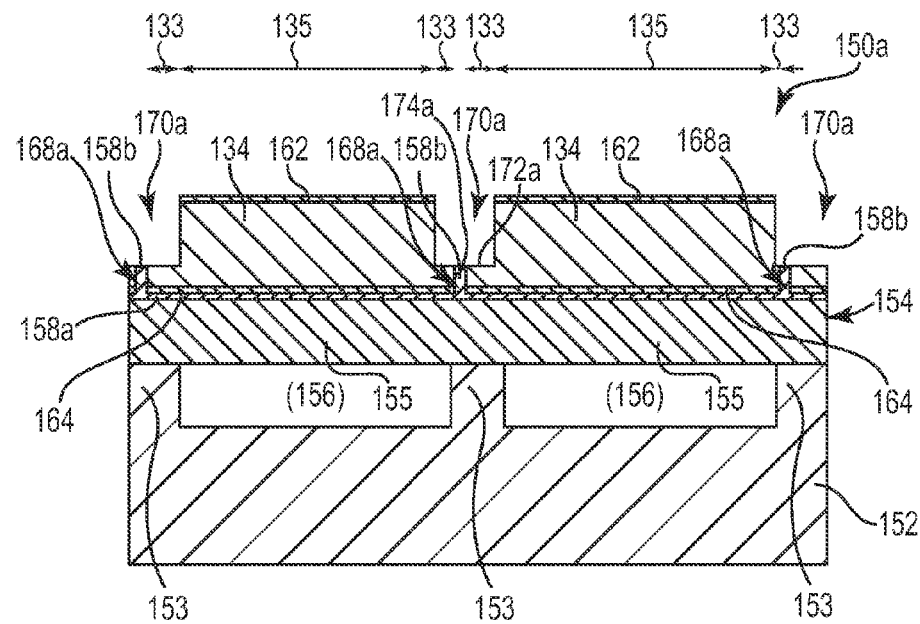
FIG. 3A illustrates a cross-sectional view of one example of a portion of the printhead assembly illustrated in FIG. 2.

FIG. 3A illustrates a cross-sectional view of one example of a portion 150a of printhead assembly 102 illustrated in FIG. 2. Portion 150a includes a substrate 152, a flexible membrane 154, and piezoelectric actuators 134. Piezoelectric actuators 134 are mechanically separated from each other by pre-slits 168a and cuts 170a.

An upper electrode 162 contacts the top surface of a central region of each piezoelectric actuator 134. A lower electrode 164 contacts the bottom surface of each piezoelectric actuator 134. Each upper electrode 162 is electrically isolated from each lower electrode 164. Each upper electrode 162 and each lower electrode 164 includes an electrically conductive material, such as a metal or other suitable electrically conductive material. In one example, each upper electrode 162 includes Cr, NiV, Au, or other suitable material, and each lower electrode 164 includes Cr, Ni, or other suitable material.

An adhesive material layer 158a, 158b bonds each piezoelectric actuator 134 to flexible membrane 154. Adhesive material 158a provides a first region of the adhesive material layer between lower electrodes 164 and flexible membrane 154. Adhesive material 158b provides a second region of the adhesive material layer, which extends from first region 158a of the adhesive material layer, between adjacent piezoelectric actuators 134. In one example, adhesive material 158b fills pre-slits 168a between adjacent piezoelectric actuators 134. In other examples, adhesive material 158b may not completely fill pre-slits 168a.

Cuts 170a extending to pre-slits 168a mechanically separate each piezoelectric actuator 134 from adjacent piezoelectric actuators 134. Cuts 170a also define edge regions 133 of each piezoelectric actuator 134. Due to cuts 170a, each edge region 133 of each piezoelectric actuator 134 has a thickness less than a thickness of a central region 135 of each piezoelectric actuator 134. In one example, each edge region 133 of piezoelectric actuator 134 has a surface 172a that is substantially coplanar with a surface 174a of second region 158b of the adhesive layer. Surface 172a of edge region 133 of each piezoelectric actuator 134 and surface 174a of each second region 158b of the adhesive layer are substantially parallel with flexible membrane 154. In one example, the outer surface of each edge region 133 of each piezoelectric actuator 134 as defined by pre-slits 168a is substantially perpendicular to flexible membrane 154.

Substrate 152, flexible membrane 154, and piezoelectric actuators 134 are arranged and interact, as described below, to eject drops of fluid from printhead assembly 102. In one example, substrate 152 has a plurality of fluid chambers 156 defined therein. Fluid chambers 156 are defined by sidewalls 153 of substrate 152. In one example, substrate 152 is a silicon substrate or another suitable substrate. Fluid chambers 156 are formed in substrate 152 using photolithography and etching techniques or other suitable fabrication techniques.

Fluid chambers 156 are connected to a supply of fluid. The fluid within each fluid chamber 156 is ejected from each fluid chamber 156 through an orifice or nozzle 104 (FIG. 1) in response to the activation of a corresponding piezoelectric actuator 134. In one example, fluid within fluid chambers 156 is ejected in a direction substantially perpendicular to a direction of displacement or deflection of flexible membrane 154 (e.g., in a direction into or out of the plane of FIG. 3A).

Flexible membrane 154 is supported by substrate 152 and extends over fluid chambers 156. In one example, flexible membrane 154 is supported by sidewalls 153 of substrate 152. Flexible membrane 154 is a single membrane extended over a plurality of fluid chambers 156. As such, in one example, flexible membrane 154 includes flexible membrane portions 155 each defined over one fluid chamber 156. Flexible membrane 154 is formed of a flexible material such as glass, a flexible thin film of silicon nitride or silicon carbide, a flexible thin layer of silicon, or other suitable flexible material. In one example, flexible membrane 154 is attached to substrate 152 by anodic bonding or other suitable technique.

Piezoelectric actuators 134 are provided on flexible membrane 154. More specifically, each piezoelectric actuator 134 is arranged on a respective flexible membrane portion 155. Piezoelectric actuators 134 deflect flexible membrane portions 155 such that when flexible membrane portions 155 of flexible membrane 154 deflect, droplets of fluid are ejected from a respective orifice or nozzle 104 (FIG. 1) of printhead assembly 102.

In one example, piezoelectric actuators 134 are provided or formed on a side of flexible membrane 154 opposite fluid chambers 156. As such, piezoelectric actuators 134 are not in direct contact with fluid contained within fluid chambers 156. Thus, potential affects of fluid contacting piezoelectric actuators 134, such as corrosion or electrical shorting, are reduced.

Each piezoelectric actuator 134 include a piezoelectric material which changes shape, for example, expands and/or contracts, in response to an electrical signal applied between upper electrode 162 and lower electrode 164. Thus, in response to the electrical signal, piezoelectric actuators 134 apply a force to respective flexible membrane portions 155 that cause flexible membrane portions 155 to deflect. The piezoelectric material may include lead zirconium titanate (PZT), zinc oxide, a piezoceramic material such as barium titanate, lead lanthanum zirconium titanate (PLZT), or other suitable piezoelectric material.

Piezoelectric actuators 134 are formed from a single or common pre-slit bulk piezoelectric material. More specifically, the single or common pre-slit bulk piezoelectric material is provided on flexible membrane 154, and selective portions of the piezoelectric material are removed via cuts 170a such that the remaining portions of the piezoelectric material define piezoelectric actuators 134.

Figure 3B:
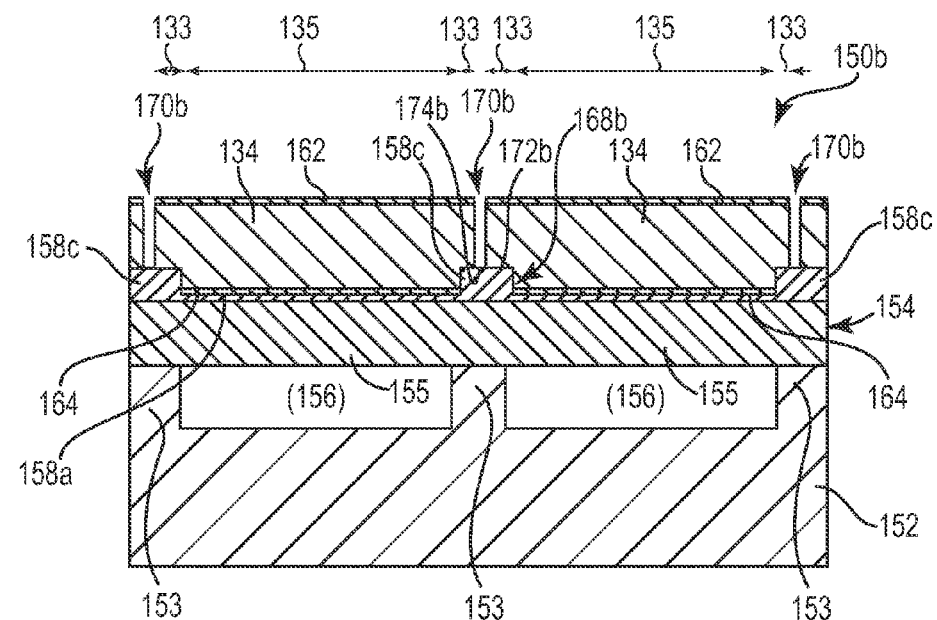
FIG. 3B illustrates a cross-sectional view of another example of a portion of the printhead assembly illustrated in FIG. 2.

FIG. 3B illustrates a cross-sectional view of another example of a portion 150b of printhead assembly 102 illustrated in FIG. 2. Portion 150b of printhead assembly 102 is similar to portion 150a previously described and illustrated with reference to FIG. 3A, except that in portion 150b pre-slits 168b are wider than pre-slits 168a and cuts 170b are narrower than cuts 170a. In another example, wide pre-slits 168b and wide cuts 170a (FIG. 3A) are used.

In this example, the adhesive layer includes adhesive material 158a and adhesive material 158c. Adhesive material 158c provides a second region of the adhesive layer, which extends from first region 158a of the adhesive layer, between adjacent piezoelectric actuators 134. In one example, adhesive material 158c fills pre-slits 168b between adjacent piezoelectric actuators 134. In other examples, adhesive material 158c may not completely fill pre-slits 168b.

Cuts 170b extending to pre-slits 168b mechanically separates each piezoelectric actuator 134 from adjacent piezoelectric actuators 134. Pre-slits 168b define edge regions 133 of each piezoelectric actuator 134. Due to pre-slits 168b, each edge region 133 of each piezoelectric actuator 134 has a thickness less than a thickness of a central region 135 of each piezoelectric actuator 134. In one example, each edge region 133 of piezoelectric actuator 134 has a surface 172b that is substantially coplanar with a surface 174b of second region 158c of the adhesive layer. Each edge region 133 of piezoelectric actuator 134 is spaced apart from flexible membrane 154 by adhesive material 158c. Surface 172b of edge region 133 of each piezoelectric actuator 134 and surface 174b of each second region 158c of the adhesive layer are substantially parallel with flexible membrane 154. In one example, the outer surface of each edge region 133 of each piezoelectric actuator 134 as defined by cuts 170b is substantially perpendicular to flexible membrane 154.

The following FIGS. 4-10 illustrate examples for fabricating a fluid ejection device, such as printhead assembly 102 including portion 150a or 150b previously described and illustrated with reference to FIGS. 1-3B. While the following FIGS. 4-10 illustrate the fabrication of two piezoelectric actuators 134 as illustrated in FIGS. 3A and 3B, the described process is applicable to the fabrication of any suitable number of piezoelectric actuators 134 for printhead assembly 102.

Figure 4:
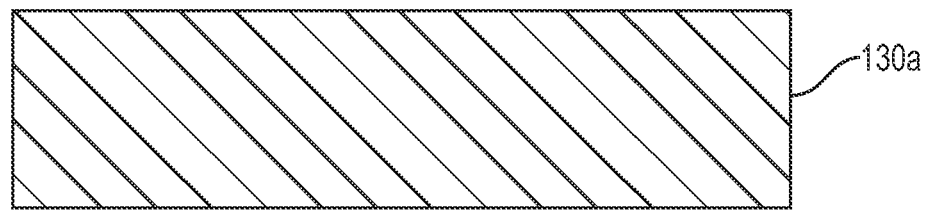
FIG. 4 illustrates a cross-sectional view of one example of a piezoelectric material layer.

FIG. 4 illustrates a cross-sectional view of one example of a piezoelectric material layer 130a. In one example, piezoelectric material layer 130a is a layer of PZT, zinc oxide, a piezoceramic material such as barium titanate, PLZT, or other suitable piezoelectric material. In one example, piezoelectric material layer 130a has a thickness between 180 μm and 400 μm. In one example, the bottom surface of piezoelectric material layer 130a is polished to reduce the roughness of the bottom surface to an Ra between 20 nm and 800 nm.

Figure 5:
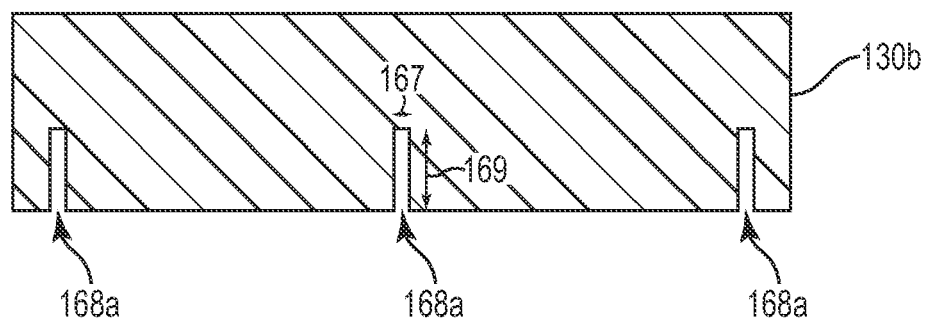
FIG. 5 illustrates a cross-sectional view of one example of the piezoelectric material layer after forming slits in the piezoelectric material layer.

FIG. 5 illustrates a cross-sectional view of one example of piezoelectric material layer 130b after forming cuts or slits 168a in piezoelectric material layer 130a. The bottom surface of piezoelectric material layer 130a is cut with a saw or other suitable tool to provide pre-slits 168a, which will subsequently be used to define each individual piezoelectric actuator 134. In one example, each pre-slit 168a has a width as indicated at 167 between 10 μm and 20 μm and a depth as indicated at 169 between 20 μm and 50 μm. In another example, piezoelectric material layer 130a is pre-slit with a saw or other suitable tool to provide pre-slits 168b as previously described and illustrated with reference to FIG. 3B. In one example, each pre-slit 168b has a width between 20 μm and 110 μm and a depth between 20 μm and 50 μm.

Figure 6:
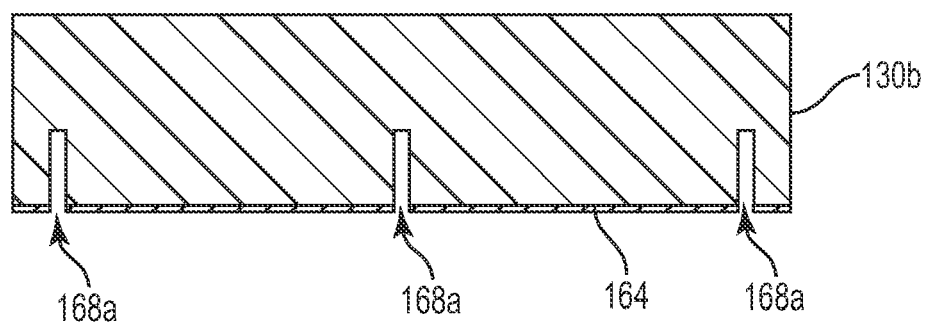
FIG. 6 illustrates a cross-sectional view of one example of a lower electrode material layer deposited on the pre-slit piezoelectric material layer.

FIG. 6 illustrates a cross-sectional view of one example of a lower electrode material layer 164 deposited on pre-slit piezoelectric material layer 130b. An electrically conductive material, such as a metal (e.g., Cr or Ni) or other suitable electrically conductive material is deposited onto the pre-slit side of pre-slit piezoelectric material layer 130b to provide lower electrode material layer 164. Lower electrode material layer 164 is deposited onto pre-slit piezoelectric material layer 130b using sputtering or other suitable deposition technique. Depending on the deposition technique used and the width of pre-slits 168a, some lower electrode material may also be deposited onto the walls of pre-slits 168a. In another example, lower electrode material layer 164 is deposited onto piezoelectric material layer 130a (FIG. 4) prior to forming pre-slits 168a in piezoelectric material layer 130a. In one example, lower electrode material layer 164 has a thickness between 0.3 μm and 1.5 μm.

Figure 7:
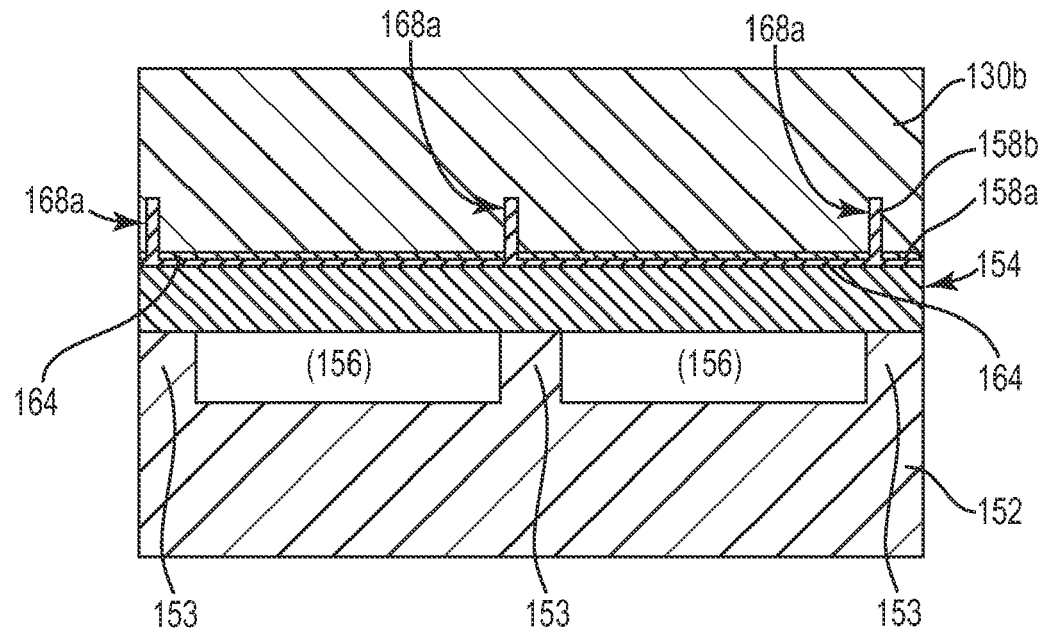
FIG. 7 illustrates a cross-sectional view of one example of the pre-slit piezoelectric material layer attached to a flexible membrane via an adhesive material layer.

FIG. 7 illustrates a cross-sectional view of one example of pre-slit piezoelectric material layer 130b attached to flexible membrane 154 via an adhesive layer 158a, 158b. Lower electrode material layer 164 and/or flexible membrane 154 is coated with an adhesive material such as epoxy or other suitable adhesive material. Pre-slit piezoelectric material layer 130b is then aligned with flexible membrane 154 such that pre-slits 168a are substantially centered between fluid chambers 156 and over sidewalls 153 of substrate 152. Pre-slits 168a may be offset from the center of sidewalls 153 of substrate 152. Pre-slits 168a may also partially overlap one or both of the adjacent fluid chambers 156 depending on the size and location of the pre-slits.

Pre-slit piezoelectric material layer 130b is then pressed onto flexible membrane 154 to attach pre-slit piezoelectric material layer 130b to flexible membrane 154. In one example, the pressing of pre-slit piezoelectric material layer 130b onto flexible membrane 154 causes pre-slits 168a to fill with adhesive material 158b. Adhesive layer 158a, 158b is then cured. In one example, the thickness of adhesive layer 158a between lower electrode material layer 164 and flexible membrane 154 is between 0.5 μm and 1.5 μm.

Figure 8:
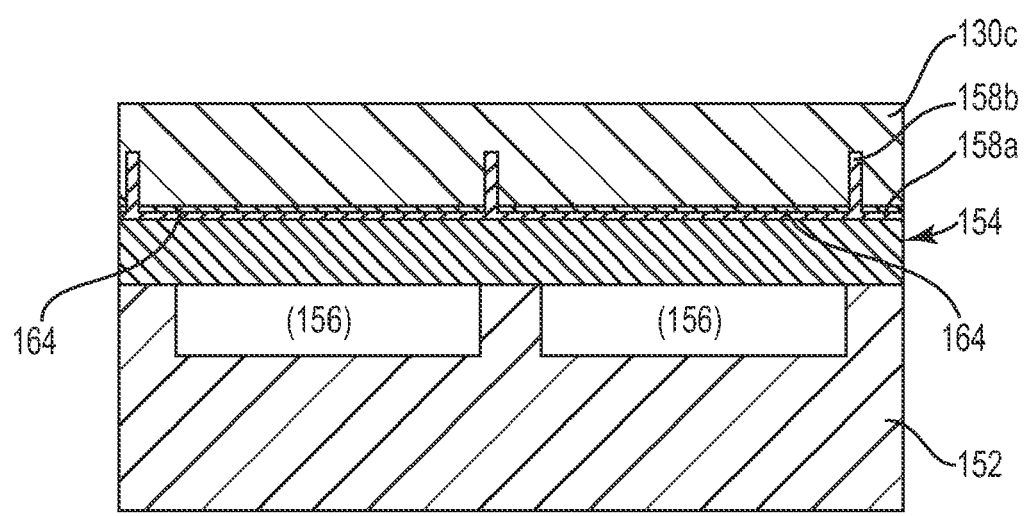
FIG. 8 illustrates a cross-sectional view of one example of the pre-slit piezoelectric material layer after backgrinding.

FIG. 8 illustrates a cross-sectional view of one example of pre-slit piezoelectric material layer 130c after backgrinding pre-slit piezoelectric material layer 130b. Pre-slit piezoelectric material layer 130b is subjected to backgrinding to reduce the thickness of the piezoelectric material layer to between 30 μm and 70 μm to provide piezoelectric material layer 130c.

Figure 9:
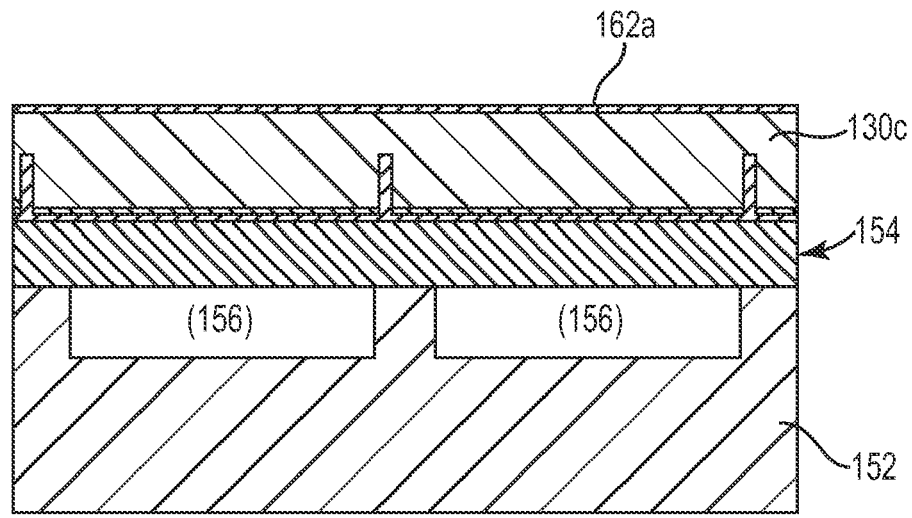
FIG. 9 illustrates a cross-sectional view of one example of an upper electrode material layer deposited on the pre-slit piezoelectric material layer.

FIG. 9 illustrates a cross-sectional view of one example of an upper electrode material layer 162a deposited on the upper surface of pre-slit piezoelectric material layer 130c. An electrically conductive material, such as a metal (e.g., Cr, NiV, or Au), or other suitable electrically conductive material is deposited onto the upper surface of pre-slit piezoelectric material layer 130c to provide upper electrode material layer 162a. Upper electrode material layer 162a is deposited onto pre-slit piezoelectric material layer 130c using sputtering or other suitable deposition technique. In one example, upper electrode material layer 162a has a thickness between 0.3 μm and 1.5 μm.

Figure 10:
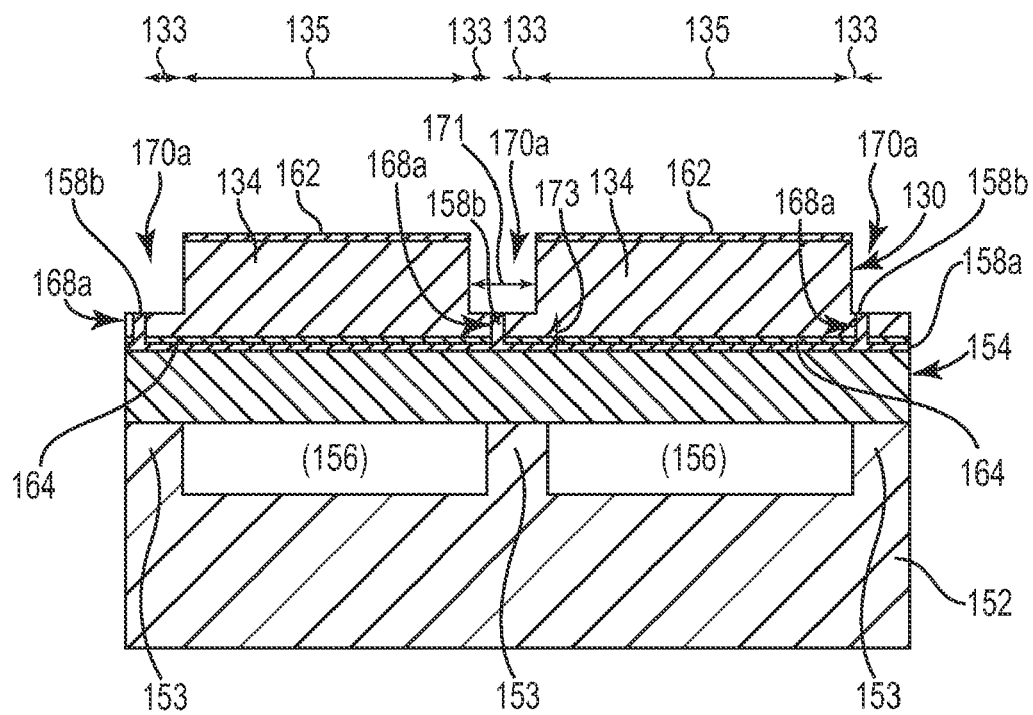
FIG. 10 illustrates a cross-sectional view of one example of the piezoelectric material layer after trimming the piezoelectric material layer to divide the piezoelectric material layer into separate piezoelectric actuators.

FIG. 10 illustrates a cross-sectional view of one example of the piezoelectric material layer 130 after trimming piezoelectric material layer 130c to divide piezoelectric material layer 130c into separate piezoelectric actuators 134. Upper electrode material layer 162a and piezoelectric material layer 130c are cut with a saw or other suitable tool at 170a to expose pre-slits 168a and adhesive material 158b. Cuts 170a are substantially aligned with sidewalls 153 of substrate 152. In one example, each cut 170a has a width as indicated at 171 between 30 μm and 90 μm and a depth such that the distance between the bottom of the cut and flexible membrane 154 as indicated at 173 is between 10 μm and 30 μm. In another example as previously described and illustrated with reference to FIG. 3B, cut 170b is used in place of cut 170a. In one example, each cut 170b has a width between 10 μm and 30 μm and a depth such that the distance between the bottom of the cut and flexible membrane 154 is between 10 μm and 30 μm. Each cut 170a intersects a pre-slit 168a to divide piezoelectric material layer 130c into separate piezoelectric actuators 134 such that each piezoelectric actuator 134 includes a central portion 135 with an upper electrode 162 deposited thereon.

Figure 11:
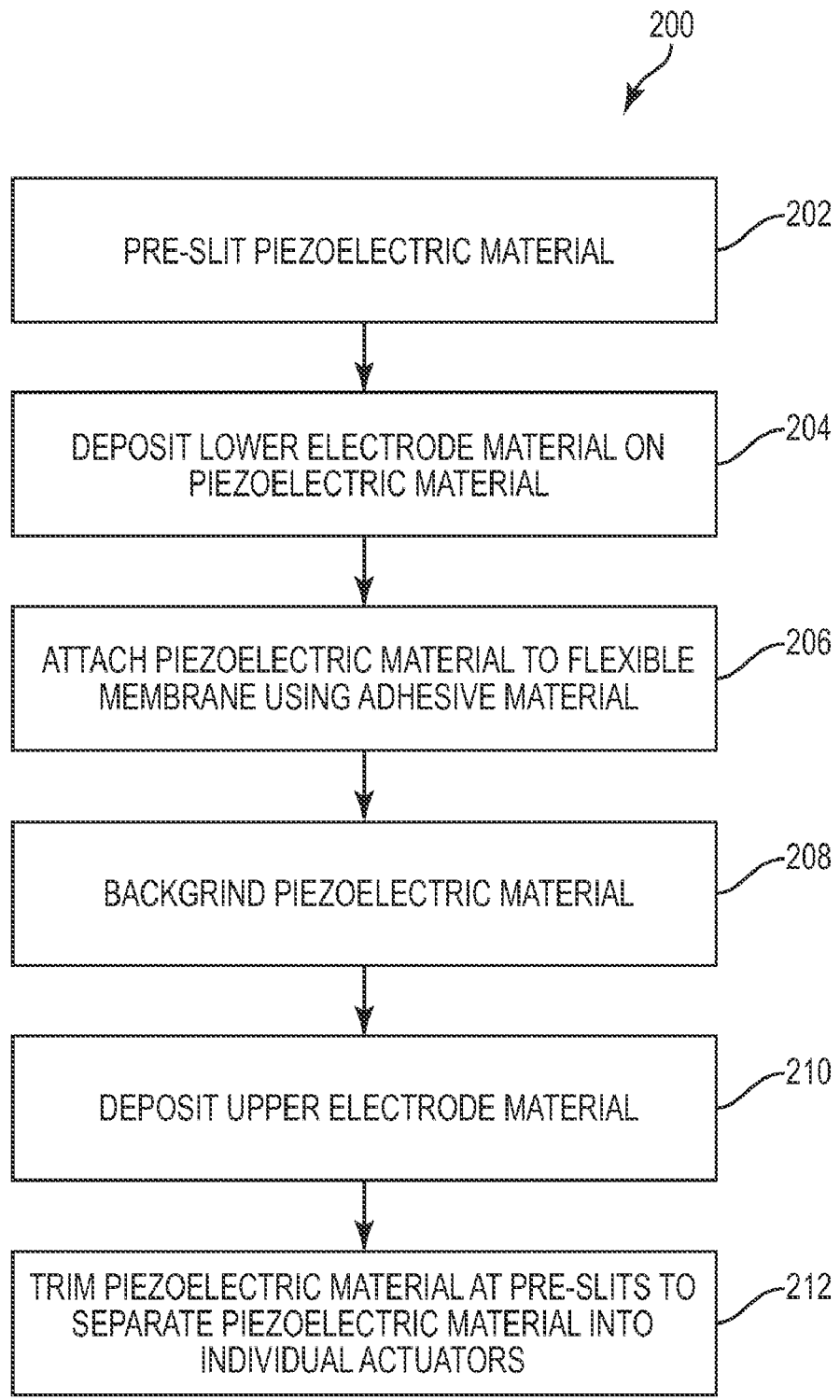
FIG. 11 is a flow diagram illustrating one example of a method for fabricating a printhead assembly.

FIG. 11 is a flow diagram illustrating one example of a method 200 for fabricating a printhead assembly, such as printhead assembly 102 previously described and illustrated with reference to FIGS. 1-3B. At 202, bulk piezoelectric material is pre-slit (e.g., FIGS. 4 and 5). At 204, a lower electrode material is deposited on the pre-slit side of the bulk piezoelectric material (e.g., FIG. 6). At 206, the piezoelectric material is attached to a flexible membrane using an adhesive material (e.g., FIG. 7). At 208, the piezoelectric material is subjected to backgrinding (e.g., FIG. 8). At 210, an upper electrode material is deposited on the piezoelectric material (e.g., FIG. 9). At 212, the piezoelectric material is trimmed at the pre-slits to separate the piezoelectric material into individual piezoelectric actuators (e.g., FIG. 10).

Examples provide a fluid ejection device including piezoelectric actuators where each of the piezoelectric actuators is mechanically separated from adjacent piezoelectric actuators. The mechanically separated piezoelectric actuators reduce crosstalk between adjacent piezoelectric actuators compared to fluid ejection devices where adjacent actuators are not mechanically separated from each other.

Although specific examples have been illustrated and described herein, it will be appreciated by those of ordinary skill in the art that a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

What is claimed is:

1. A fluid ejection device comprising:
a flexible membrane;
an adhesive layer on the flexible membrane, the adhesive layer comprising a first region and a second region extending from the first region; and
a piezoelectric material layer comprising an edge region and a central region, a surface of the edge region spaced apart from a surface of the central region in a direction substantially perpendicular to the flexible membrane, and the surface of the edge region of the piezoelectric material layer substantially coplanar with a surface of the second region of the adhesive layer,
wherein the surface of the edge region and the surface of the second region are substantially parallel with the flexible membrane, and
wherein the surface of the central region faces away from the flexible membrane.

2. The fluid ejection device of claim 1, further comprising:
a first electrically conductive layer between the piezoelectric material layer and the adhesive layer; and
a second electrically conductive layer on the central region of the piezoelectric material layer, the second electrically conductive layer electrically isolated from the first electrically conductive layer.

3. The fluid ejection device of claim 1, wherein the edge region of the piezoelectric material layer is spaced apart from the flexible membrane by the second region of the adhesive layer.

4. The fluid ejection device of claim 1, wherein a surface of the edge region of the piezoelectric material layer is substantially perpendicular to the flexible membrane.

5. The fluid ejection device of claim 1, wherein the central region of the piezoelectric material layer is thicker than the edge region of the piezoelectric material layer in a direction substantially perpendicular to the flexible membrane.

6. The fluid ejection device of claim 1, wherein the piezoelectric material layer comprises a PZT layer.

7. The fluid ejection device of claim 1, wherein a surface of the edge region of the piezoelectric material layer is perpendicular to the flexible membrane.

8. The fluid ejection device of claim 4, wherein the surface of the edge region of the piezoelectric material layer substantially perpendicular to the flexible membrane contacts the second region of the adhesive layer.

9. The fluid ejection device of claim 7, wherein the surface of the edge region of the piezoelectric material layer perpendicular to the flexible membrane extends between the surface of the edge region and the surface of the central region.

10. A fluid ejection device comprising:
a flexible membrane supported by a substrate and over a fluid chamber;
an adhesive layer on the flexible membrane, the adhesive layer comprising a first region and a second region extending from the first region;
a piezoelectric material layer comprising an edge region and a central region, a surface of the edge region spaced part from a surface of the central region in a direction substantially perpendicular to the flexible membrane, and the surface of the edge region of the piezoelectric material layer substantially coplanar with a surface of the second region of the adhesive layer;
a first metal layer between the piezoelectric material layer and the adhesive layer; and a second metal layer on the central region of the piezoelectric material layer opposite the first metal layer, the second metal layer electrically isolated from the first metal layer, wherein the surface of the edge region and the surface of the second region are substantially parallel with the flexible membrane, and wherein the surface of the central region faces away from the flexible membrane.

11. The fluid ejection device of claim 10, wherein the central region of the piezoelectric material layer is thicker than the edge region of the piezoelectric material layer in a direction substantially perpendicular to the flexible membrane.

12. The fluid ejection device of claim 10, wherein the first metal layer provides a first electrode and the second metal layer provides a second electrode, the first and second electrodes configured to deform the piezoelectric material layer in response to an applied voltage to deflect the flexible membrane.

13. The fluid ejection device of claim 10, wherein the flexible membrane comprises glass, wherein the first metal layer comprises one of Cr and Ni, wherein the second metal layer comprise one of Cr, NiV, and Au, wherein the piezoelectric material layer comprises a PZT layer, and wherein the adhesive layer comprises an epoxy.

14. The fluid ejection device of claim 10, wherein a surface of the edge region of the piezoelectric material layer is perpendicular to the flexible membrane.

15. The fluid ejection device of claim 14, wherein the surface of the edge region of the piezoelectric material layer perpendicular to the flexible membrane extends between the surface of the edge region and the surface of the central region.

* * * * *

UNITED STATES PATENT AND TRADEMARK OFFICE
CERTIFICATE OF CORRECTION

PATENT NO.      : 8,348,396 B2
APPLICATION NO. : 13/156770
DATED           : January 8, 2013
INVENTOR(S)     : Jeffrey R. Pollard It is certified that error appears in the above-identified patent and that said Letters Patent is hereby corrected as shown below:

In column 8, line 61, in Claim 10, delete "part" and insert -- apart --, therefor.

Signed and Sealed this
Second Day of April, 2013

Teresa Stanek Rea
*Acting Director of the United States Patent and Trademark Office*